United States Patent [19]

Kishi

[11] 4,278,901

[45] Jul. 14, 1981

[54] PULSIVE COMPONENT DETECTING APPARATUS

[75] Inventor: Hiroyasu Kishi, Gunma, Japan

[73] Assignees: Sanyo Electric Co., Ltd., Osaka; Tokyo Sanyo Electric Co., Ltd., Gunma, both of Japan

[21] Appl. No.: 22,342

[22] Filed: Mar. 20, 1979

[30] Foreign Application Priority Data

Jun. 9, 1978 [JP] Japan .............................. 53-70603
Jun. 19, 1978 [JP] Japan .............................. 53-75769
Jun. 19, 1978 [JP] Japan .............................. 53-75770

[51] Int. Cl.$^3$ .......................................... H03K 5/153
[52] U.S. Cl. .................................. 307/350; 307/264; 307/363; 307/546; 330/254
[58] Field of Search ............... 307/237, 264, 350, 354, 307/362, 363; 328/115, 139; 330/254, 258; 455/307, 309

[56] References Cited

U.S. PATENT DOCUMENTS

| 3,005,048 | 10/1961 | Goodrich | 307/363 X |
| 4,124,819 | 11/1978 | Hansen | 307/237 X |
| 4,197,505 | 4/1980 | Nishisima et al. | 307/237 X |

*Primary Examiner*—John Zazworsky
*Attorney, Agent, or Firm*—Darby & Darby

[57] ABSTRACT

An input signal could include a pulsive noise such as an ignition noise in superposition on a continuous noise such as a white noise. Such input signal is commonly applied to the respective base electrodes of paired transistors of the same conductivity type connected in a differential amplifier fashion. The amplified signal is then applied to a rectifying circuit, where the signal is full-wave rectified, and the output of the rectifying circuit is detected by a detector. The detected output is then applied to the base electrode of a first transistor. A second transistor is provided such that a current mirror circuit is formed between the collector electrode of the second transistor and the collector electrode of the first transistor. A diode circuit is connected between the current mirror circuit and the collector electrode of the second transistor in the forward direction. The diode circuit comprises a parallel connection of two diode-series connections, the junction of one diode-series connection being connected to the base electrode of one of the paired transistors and the junction of the other diode-series connection being connected to the base electrode of the other transistor of the paired transistors. The output of the rectifying circuit is further applied to a pulsive noise detecting circuit, which is adapted to level detect the noise at a predetermined level higher than the level of the continuous noise, thereby to detect presence or absence of a pulsive noise.

28 Claims, 9 Drawing Figures

PULSIVE COMPONENT DETECTING APPARATUS

BACKGROUND OF THE INVENTION

1. Field of the Invention

The present invention relates to a circuit for detecting a pulsive component in a signal. More specifically, the present invention relates to an apparatus for detecting a pulsive component for use in a pulsive noise removing apparatus in an FM receiver.

2. Description of the Prior Art

It has been well known that a pulsive noise such as an ignition noise generated by an automobile could interfere with normal reception by an FM receiver. Since such pulsive noise serves to phase modulate the FM signal, the same cannot be removed even by the use of a limiter and hence is transferred to a subsequent stage in the receiver after detection by a detector. Accordingly, it is necessary to remove such pulsive noise in a signal transmission path subsequent to a detector.

Figure 1:
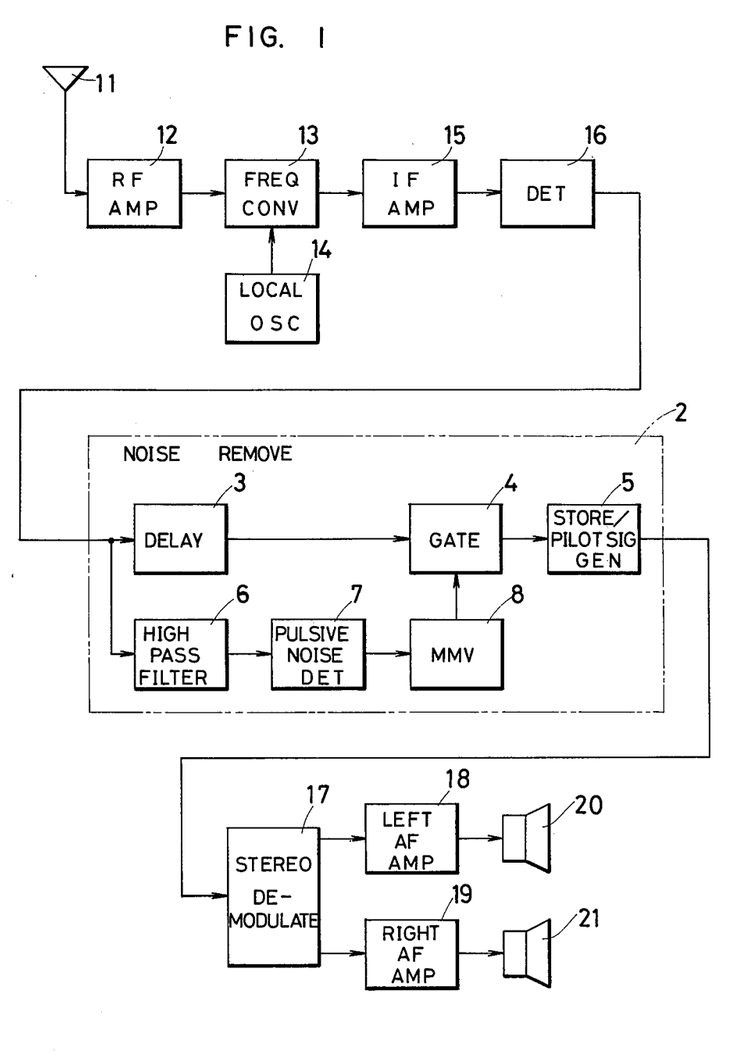
FIG. 1 is a block diagram showing one example of an FM stereo receiver employing a typical noise removing apparatus wherein the present invention can be advantageously employed.

Referring to FIG. 1, there is shown a block diagram of an FM radio receiver employing a typical noise removing apparatus where the present invention can be advantageously employed. Referring to FIG. 1, the FM radio receiver shown comprises an antenna 11 for receiving a broadcast FM signal wave, a radio frequency amplifier 12 for amplifying the FM signal received by the antenna 11, a local oscillator 14 for generating a local oscillation signal for the purpose of frequency conversion, a frequency converter 13 for mixing the amplified FM signal from the radio frequency amplifier 12 with the local oscillation signal for converting the frequency of the FM signal into an intermediate frequency, an intermediate frequency amplifier 15 for amplifying the intermediate frequency signal from the frequency converter 13, an FM detector 16 for demodulating the intermediate frequency signal into the original low frequency signal, a stereo demodulating circuit 17 for demodulating the low frequency signal from the FM detector 16 into the original stereo signal, left and right audio frequency amplifiers 18 and 19 for amplifying the demodulated stereo left and right signals, and left and right loud speakers 20 and 21 for converting the amplified left and right audio frequency signals into the left and right sounds. Detailed structure and operation of the respective blocks are well known to those skilled in the art. Hence, it is not believed necessary to describe the same here in more detail.

In the FM stereo receiver shown, the output of the detector 16 is applied through a noise removing circuit 2 to the stereo demodulating circuit 17. The noise removing circuit 2 basically comprises a delay circuit for delaying, say for 3 to 5 microseconds, the output of the detector 16, a gate circuit 4 for gating the signal to remove a noise component from the delayed output of the delay circuit 3 and a store/pilot signal generating circuit 5 connected to receive the output of the gate circuit 4. The noise removing circuit 2 further comprises a high-pass filter 6, a noise detector 7 and a monostable multivibrator 8 for controlling the gate circuit 4. The high-pass filter 6 is designed to detect the energy of a noise component included in the output of the detector 16 and is adapted to pass the signal component of the frequency higher than the audible frequency. The pulse noise detector 7 is aimed to detect a pulsive noise in the output of the high-pass filter 6 and is adapted to trigger the monostable multivibrator 8 upon detection of such pulsive noise. The monostable multivibrator 8 provides an output to the gate circuit 4 for a predetermined time period after the same is triggered. Accordingly, the gate circuit 4 is disabled or opened when the output is obtained from the monostable multivibrator 8, thereby to prevent the signal from the delay circuit 3 from being applied to the stereo demodulating circuit 17 for the above described time period. The store/pilot signal generating circuit 5 comprises a capacitor, not shown, for storing the signal level immediately before the gate circuit 4 is opened and a pilot signal generating circuit, not shown, for generating a pseudo pilot signal for use in stereo demodulation.

A detailed structure of one example of such store/pilot signal generating circuit is seen in U.S. Pat. No. 3,739,285, issued June 12, 1973 to United States Philips Corporation and entitled "CIRCUIT ARRANGEMENT FOR SUPPRESSING INTERFERENCES IN AN FM RADIO RECEIVER". Briefly described, the above referenced U.S. Pat. No. 3,739,285 discloses a store/pilot signal generating circuit comprising a capacitor for storing the signal level at a gate circuit and a parallel resonance circuit connected in series with the storing capacitor. In the following the store/pilot signal generating circuit of the above referenced patent will be described in more detail on the assumption that the same is employed in the FIG. 1 FM receiver. The parallel resonance frequency of the parallel resonance circuit is selected to be the frequency of the pilot signal of the FM stereo broadcasting signal, for example, 19 kHz. Accordingly, the signal level immediately before the gate circuit 4 is opened is maintained in the storing capacitor, while the pilot signal necessary for stereo demodulation is obtained from the parallel resonance circuit as a parallel resonance oscillation signal, which is effective for stereo demodulation in the stereo demodulating circuit 17 in the subsequent stage. With such circuit configuration, the gate circuit 4 is opened when a pulsive noise is received, whereby such noise component is prevented from being applied to the stereo demodulating circuit 17 in the subsequent stage. In addition, when the gate circuit 4 is closed, the signal level maintained by the storing capacitor is obtained, whereby the continuity of the signal is established. Accordingly, the referenced patent is effective to reduction of a pulsive noise. At the same time, the pilot signal necessary for stereo demodulation is not interrupted and thus stereo demodulation during a time period when the gate circuit 4 is opened is not adversely affected. In spite of the above described advantageous features of the store/pilot signal generating circuit disclosed and claimed in the above referenced U.S. Pat. No. 3,739,285, the same also involves the following shortcomings.

More specifically, with the store/pilot signal generating circuit disclosed and claimed in the above referenced U.S. Pat. No. 3,739,285, one series resonance circuit can also be formed by the storing capacitor and the parallel resonance circuit. Formation of such series resonance circuit, however, causes distortion of the signal being applied to the stereo demodulating circuit 17 at such series resonance frequency. Since the frequency causing the above described distortion, i.e. the frequency of the thus formed series resonance circuit is necessarily lower than the resonance frequency of 19 kHz of the parallel resonance circuit and falls in the audible frequency region, distortion is naturally caused in the sound produced from the speakers 20 and 21. In addition, another problem is caused by virtue of the above described series resonance. More specifically, assuming a case where the signal of the frequency commensurate with the frequency of the above described series resonance circuit is obtained when a pulsive noise is incidentially received, then the gate circuit 4 is naturally opened responsive to the pulsive noise and the signal level at that time is stored in the storing capacitor and thereafter the gate circuit 4 is closed when the signal level as stored is obtained. However, the electric charge that has been charged in the capacitor constituting the parallel resonance circuit is discharged at the same time and as a result a much increased noise component is withdrawn from the store/pilot signal generating circuit 5.

On the other hand, on the occasion of no input signal, the pilot signal obtained from the parallel resonance circuit during a time period when the gate circuit 4 is opened becomes a large level, which is then applied to the stereo demodulating circuit 17. Accordingly, the stereo demodulating circuit 17 is placed in a condition wherein proper demodulation of a left signal or a right signal cannot be performed by virtue of the above described continuous large amplitude pilot signal and as a result such phenomenon can be heard as a noise from the speakers 20 and 21.

In order to eliminate the above described shortcomings of the above referenced U.S. Pat. No. 3,739,285, a pulsive noise removing apparatus of a totally different principle was proposed in U.S. Pat. No. 4,066,845, issued Jan. 3, 1978 to the same assignee as the present invention and entitled "PULSIVE NOISE REMOVING APPARATUS FOR AN FM RECEIVER". The second referenced U.S. Pat. No. 4,066,845 is directed to a pulsive noise removing apparatus for an FM receiver comprising a bandpass-amplifier for selectively amplifying a signal of the reference frequency such as the pilot signal frequency of 19 kHz or the subcarrier signal frequency of 38 kHz, and an attenuation circuit for attenuating the output of the bandpass-amplifier at a rate commensurate with the gain of the bandpass-amplifier, without employing a parallel resonance circuit, for the purpose of preventing the pilot signal from being interrupted for a time period when the gate circuit 4 is opened, whereby a positive feedback circuit is supplied to the bandpass-amplifier by means of a closed loop including the attenuation circuit and the storing capacitor, so that the bandpass-amplifier cooperates with the positive feedback circuit to serve as an oscillator when the gate circuit 4 is opened, whereby the pilot signal or the subcarrier signal is applied to the stereo demodulating circuit 17 without being interrupted. The second referenced U.S. Pat. No. 4,066,845 can achieve the same advantageous features as those achieved by the first referenced U.S. Pat. No. 3,739,285, while the second referenced U.S. Pat. No. 4,066,845 totally eliminates the above described serious shortcomings involved in the first referenced U.S. Pat. No. 3,739,285.

Thus, it has been a conventional practice that a pulsive noise is detected and an input signal is interrupted in being applied to a stereo demodulating circuit for a time period of the pulsive noise, whereby a pulsive noise is removed. The present invention is directed to a pulsive component detecting apparatus that can be advantageously employed in the above described conventional pulsive noise removing apparatus. However, the present invention could provide a variety of applications.

In view of the fact that an FM receiver is usually of a nature that a white noise becomes relatively larger when a signal of a medium or weak intensity of electric field is received, a conventional pulsive noise detecting apparatus usually employed in an FM receiver involved a shortcoming that such a relatively larger white noise on the occasion of reception of a medium or weak intensity of electric field is erroneously detected as a pulsive noise. It has been observed that such shortcoming becomes conspicuous when a quadrature detector suited for implementation in an integrated circuit is employed as the detector 7. However, the same applies more or less to a well known ratio detector being employed as the detector 7. In order to prevent such malfunction by virtue of a relatively large white noise, one might think of a decrease of the gain of the amplifier included in the pulsive noise detecting apparatus in association with an increase of the white noise level. However, such approach of decreasing the gain of the amplifier entails another shortcoming in that the dynamic range becomes narrow.

SUMMARY OF THE INVENTION

Briefly described, the present invention comprises an apparatus for detecting a pulsive component in an input signal including a pulsive component in superposition on a continuous component, comprising an amplifying means for amplifying an input signal, characterized in that the amplitude of the input signal being applied to the amplifying means is limited in association with the level of the continuous component included in the output of the amplifying means, whereby malfunction by virtue of an increase of the continuous component is prevented.

According to the present invention, the level of the continuous component included in the input signal can be maintained substantially constant, which enables assured prevention of malfunction by virtue of an increase of the continuous component through proper setting of a detecting level of a pulsive component in superposition on the continuous component. Since the amplitude of the input signal is limited in making the level of the continuous component substantially constant, the dynamic range can be maintained as broad as it is, as different from a case where the gain of the amplifier is controlled.

In a preferred embodiment of the present invention, various additional means may be provided for the purpose of protecting the circuit from being damaged when too large an input signal is received. Accordingly, circuit components such as transistors employed in the inventive apparatus can be prevented from being damaged by virtue of too large an input signal.

Accordingly, a principal object of the present invention is to provide an improved pulsive component detecting apparatus for detecting a pulsive component in superposition on a continuous component of an input signal.

Another object of the present invention is to provide a pulsive component detecting apparatus for detecting a pulsive component in superposition on a continuous component in an input signal, which is immune to malfunction of pulsive component detection by virtue of variation of the continuous component in the input signal.

A further object of the present invention is to provide a pulsive component detecting apparatus for detecting a pulsive component in superposition on a continuous component in an input signal, which is capable of effectively detecting only a pulsive component without decreasing a dynamic range of the detecting apparatus.

Still a further object of the present invention is to provide a pulsive component detecting apparatus for detecting a pulsive component in superposition on a continuous component in an input signal, which comprises means for protecting circuit components of the apparatus from being damaged by virtue of too large an input signal.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
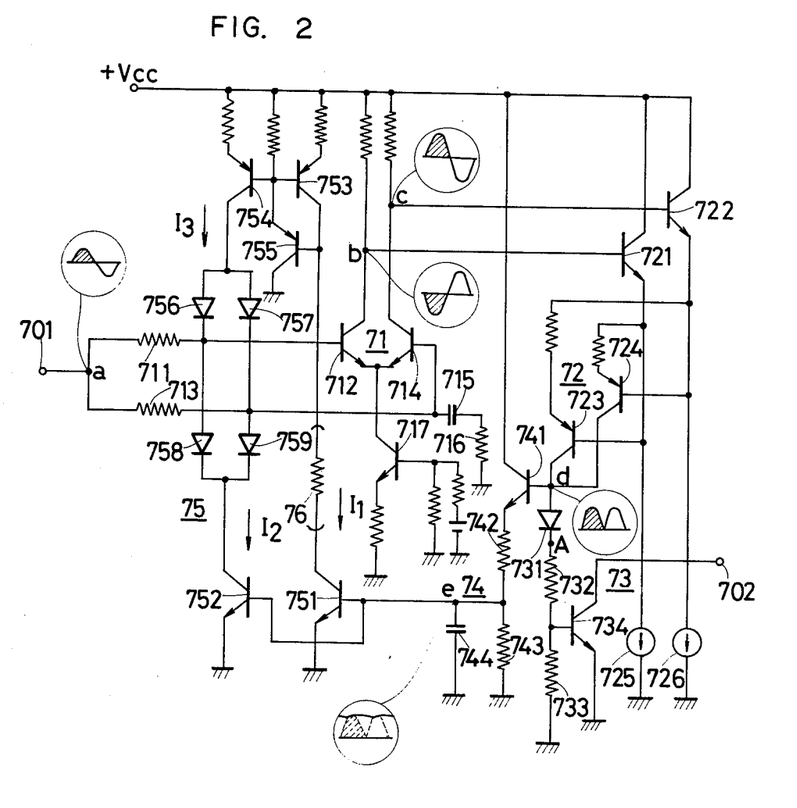
FIG. 2 is a schematic diagram of one embodiment of the present invention.

FIG. 2 shows a schematic diagram of one embodiment of the present invention. A pulsive noise detecting circuit 7 of the embodiment shown comprises a differential amplifier 71 connected to receive a signal from an input terminal 701, a rectifying circuit 72 for rectifying the output of the differential amplifier 71, a pulsive noise detecting circuit 73 for detecting a pulsive noise responsive to the output of the rectifying circuit 72, a detecting circuit 74 for detecting the output of the rectifying circuit 72 and an input limiting circuit 75 for limiting the amplitude of the input of the differential amplifier 71 responsive to the output of the detecting circuit 74. The differential amplifier 71 comprises a pair of NPN transistors 712 and 714 of similar characteristics. The base electrode of each of the pair of transistors 712 and 714 is connected through each of the base resistors 711 and 713 commonly connected to input terminal 701 to receive an input signal therefrom. The emitter electrode of each of these two transistors 712 and 714 is commonly connected to a constant current source including a constant current transistor 717. The base electrode of one of the pair of transistors 712 and 714, the transistor 714 in the embodiment shown, is connected through a series connection of a capacitor 715 and a resistor 716 to ground. The output of the differential amplifier 71, i.e. the collector electrodes of the pair of transistors 712 and 714 are connected to the rectifying circuit 72.

The rectifying circuit 72 is aimed to rectify in a full rectifying manner the output of the differential amplifier 71. The rectifying circuit 72 comprises two rectifying transistors 723 and 724, each of which may comprise a PNP transistor. The base electrode of the transistor 723 is connected to the emitter electrode of the transistor 721 and the emitter electrode of the transistor 721 is connected to the constant current source 725. The base electrode of the transistor 724 is connected to the emitter electrode of the transistor 722 and the emitter electrode of the transistor 722 is connected to the constant current source 726. The emitter electrode of the rectifying transistor 723 is connected through a suitable resistor to the emitter electrode of the transistor 722 and the emitter electrode of the rectifying transistor 724 is connected through a suitable resistor to the emitter electrode of the transistor 721. Accordingly, the transistors 721 and 722 serve to convert the impedance of the output of the differential amplifier 71 so as to determine the operation points of the corresponding rectifying transistors 723 and 724. The output of the rectifying circuit 72, i.e. the collector electrodes of the rectifying transistors 723 and 724 are both connected to the detecting circuit 74 and the pulse detecting circuit 73.

The pulse detecting circuit 73 comprises a diode 731 the anode of which is connected to the output of the rectifying circuit 72. The cathode of the diode 731 is connected to one end of a resistor 732. The other end of the resistor 732 is connected to one end of a resistor 733 and is also connected to the base electrode of the transistor 734. The other end of the resistor 733 is connected to the ground. Accordingly, the base bias, i.e. a threshold value of the transistor 734 is determined by a voltage division ratio of the two resistors 732 and 733. The emitter electrode of the transistor 734 is connected to the ground and the collector electrode of the transistor 734 is connected to an output terminal 702 of the circuit 7.

The detecting circuit 74 comprises a transistor 741 connected to receive the output of the rectifying circuit 72. The transistor 741 may comprise an NPN transistor, the base electrode of which is connected to the output of the rectifying circuit 72 and the emitter electrode of which is connected to the ground through a series connection of resistor 742 and 743. The resistor 743 is shunted by a smoothing capacitor 744. The smoothing capacitor 744 is accordingly charged through the resistor 742 responsive to the output of the detecting transistor 741. The resistor 743 serves as a discharging resistor of the smoothing capacitor 744. The junction of the resistors 742 and 743, i.e. one end of the capacitor 744 is connected to the respective base electrodes of transistors 751 and 752 included in the amplitude limiting circuit 75.

The transistors 751 and 752 of the input limiting circuit 75 may comprise NPN transistors, the emitter electrodes of which are connected to the ground. The collector electrode of the transistor 751 is connected to the collector electrode of one of a pair of transistors 753 and 754, i.e. the transistor 753 in the embodiment shown, constituting a current mirror circuit. The pair of transistors 753 and 754 may comprise PNP transistors, the base electrodes of which are commonly connected to the emitter electrode of a transistor 755. The transistor 755 may also comprise a PNP transistor, the base electrode of which is connected to the collector electrode of the transistor 753. The collector electrode of the transistor 754 is connected to the collector electrode of the above described transistor 752 through a diode circuit. The diode circuit comprises four diodes 756, 757, 758 and 759, wherein the diodes 756 and 758 are connected in series while the diodes 757 and 759 are connected in series, these two series connections of diodes being connected in parallel. The cathode of the diode 756 and thus the anode of the diode 758 is connected to the base electrode of one transistor 712 constituting the above described differential amplifier 71. Similarly, the cathode of the diode 757 and thus the anode of the diode 759 is connected to the base electrode of the transistor 714.

Since the circuit configuration was described in the foregoing, the operation of the embodiment shown will be described with reference to FIGS. 3 and 4.

For facility of explanation, let it be assumed that a continuous noise component such as a white noise being applied to the input terminal 701 is represented by a sine wave as shown as (a). Further let it be assumed that in an initial condition the smoothing capacitor 744 has not been charged and the first and second control transistors 751 and 752 have been placed in a non-conductive state. Then an input signal applied to the input terminal 701 is applied to the base electrode of one transistor 712 of the differential amplifier 71. On the other hand, the base electrode of the other transistor 714 of the differential amplifier 71 is supplied with an input signal as voltage divided by means of the resistors 713 and 716, because the capacitance of the capacitor 715 is sufficiently large enough to provide a low impedance. Accordingly, the differential of the input signals at the base electrodes of both transistors 712 and 714 is amplified, whereby a signal as shown as (b) is obtained at the collector electrode of one transistor 712 and a signal as shown as (c) is obtained at the collector electrode of the other transistor 714. The signal (b) obtained at the collector electrode of one transistor 712 is subjected to impedance conversion by means of the first impedance converting transistor 721, while the signal (c) obtained at the collector electrode of the other transistor 714 is subjected to impedance conversion by means of the second impedance converting transistor 722, whereby the impedance converted outputs are obtained at the emitter electrodes of the respective transistors 721 and 722.

The signals obtained at the emitter electrodes of the first and second impedance converting transistors 721 and 722 are rectified in a full rectifying manner by means of the transistors 723 and 724 included in the full-wave rectifying circuit 72. More specifically, the base electrode of the first rectifying transistor 723 is connected to the emitter electrode of the first impedance converting transistor 721 and the emitter electrode of the first rectifying transistor 723 is connected to the emitter electrode of the second impedance converting transistor 722. Therefore, the first rectifying transistor 723 becomes conductive during the positive half cycle of the signal (c). Similarly, the second rectifying transistor 724 becomes conductive during the positive half cycle of the signal (b). Since the collector electrodes of the first and second rectifying transistors 723 and 724 are commonly connected, a signal as shown as (d) is obtained at the commonly connected collector electrodes of the transistors 723 and 724 and thus at the output of the rectifying circuit 72.

The smoothing capacitor 744 is charged by the emitter current of the detecting transistor 741. If and when the signal (d) is applied to the base electrode of the transistor 741, the transistor 741 becomes conductive, so that the voltage (e) across the smoothing capacitor 744 varies as shown as (e). If and when the resistance value of the discharging resistor 743 is selected to be sufficiently large as compared with the resistance value of the charging resistor 742, then a peak detected waveform of the signal (d) is obtained at one end of the capacitor 744.

If and when the signal (d) becomes large so that the level of the signal (e) exceeds a predetermined value, i.e. the base-emitter voltage of the transistors 751 and 752, the first and second control transistors 751 and 752 start conducting. Assuming that the collector current of the first control transistor 751 at that time is $I_1$ and the collector current of the second control transistor 752 at that time is $I_2$, then the following equation is obtained:

$$I_1 = I_2 \tag{1}$$

When the transistors 751 and 752 become conductive, the four diodes 756, 757, 758 and 759 constituting the diode circuit become conductive. On the other hand, the current mirror circuit is designed such that the same current as the collector current of the transistor 753 flows through the collector electrode of the transistor 754. Accordingly, the collector current of the above described transistor 754 is $I_3$, then the following equation is obtained:

$$I_3 = I_1 \tag{2}$$

From the equations (1) and (2), the following equation is obtained:

$$I_3 = I_2 \tag{3}$$

The voltage across the smoothing capacitor 744 is restricted by the base-emitter voltage of the first or second control transistor 751 or 752. The above described collector currents $I_1$ and $I_2$ vary in association with the base currents of the first and second control transistors 751 and 752 and accordingly the impedance values of the diodes 756, 757, 758 and 759 vary. Since the equation (3) is met at that time, the base bias current of the differential amplifier 71 does not vary by virtue of the current flowing through the above described diodes 756, 757, 758 and 759 and thus the gain of the differential amplifier 71 does not vary.

If and when the input signal (a) becomes large so that the first control transistor 751 becomes conductive, then the impedance of the diodes 756, 757, 758 and 759 decreases and hence the voltage between the base electrodes of both transistors 712 and 714 of the differential amplifier 71 becomes small. Therefore, the signals (b) and (c) become small and as a whole an increase of the above described input signal (a) is suppressed by virtue of a negative feedback operation. Accordingly, the above described signals (b) and (c) are controlled to be constant. Since the above described signals (b) and (c) are controlled to become constant, the signal (d) also becomes constant. Accordingly, so large a continuous noise as to exceed the detecting level of the pulse noise detecting circuit 73 is prevented from being applied to the base electrode of the detecting transistor 734.

Now the operation of pulsive noise detection will be described in the following. Since a control is achieved such that a continuous noise such as a white noise controlled to be of a constant level, as described previously, a continuous noise including a pulsive noise as shown at the point A can be shown as shown in FIG. 3. Referring to FIG. 3, a signal having the level approximately at $V_{BE}$ represents a continuous noise and the reference characters P1, P2 and P3 denote pulsive noises.

On the other hand, assuming that the resistance values of the voltage dividing resistors 732 and 733 are R1 and R2 and the signal obtained at the above described point A is $V_A$, then the base voltage $V_B$ of the detecting transistor 734 is expressed by the following equation:

$$V_B = R2/R1 + R2)V_A \quad (4)$$

The detecting transistor 734 becomes conductive if and when the base voltage $V_B$ becomes larger than the base-emitter voltage $V_{BE}$. Now assuming that R1=R2, then the equation (4) may be rewritten as follows:

$$V_B = \tfrac{1}{2} V_A \quad (4')$$

Thus, if and when the voltage $V_A$ becomes larger than the value $2V_{BE}$, then the above described detecting transistor 734 becomes conductive.

Figure 3:
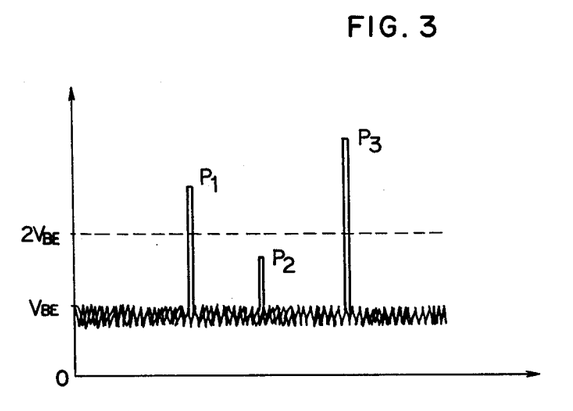
FIG. 3 shows a waveform of one example of the signal at the point A in FIG. 2.
Figure 4:
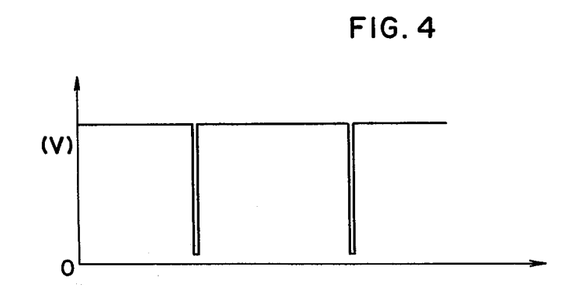
FIG. 4 shows a waveform of the signal obtained at the output terminal of the FIG. 2 diagram in association with the FIG. 3 signal.

Accordingly, assuming that a signal as shown in FIG. 3 is applied to the point A, then a signal as shown in FIG. 4 is obtained at the output terminal 702. Pulsive noise detection is thus completed when the signal as shown in FIG. 4 is obtained. Although the pulsive noise P2 does not appear as an output, a pulsive noise of a level similar to that of a continuous noise need not be detected. However, if it is desired that a pulsive noise such as P2 be detected, the same can be detected by changing the voltage division ratio by the voltage dividing resistors 732 and 733. Since a pulsive noise has a small pulse width, the input limiting circuit 75 is very little influenced to be negligible.

As described in the foregoing, the embodiment shown of the inventive pulsive noise detecting circuit brings about the advantages that the level of a continuous noise can be maintained constant and thus the detecting level of a pulsive noise can be maintained constant. The embodiment shown further brings about another advantage that malfunction by virtue of a continuous noise can be assuredly prevented by propery setting the above described detecting level and thus the ratio of the resistors 732 and 733. According to the embodiment shown, a further advantage is brought about that since an input signal is controlled in maintaining the continuous noise level constant a pulsive noise detecting apparatus can be provided wherein the dynamic range of an input is broad and the dynamic range of the output is also broad.

Referring FIG. 2, there is a fear that in the FIG. 2 diagram the first and second control transistors 751 and 752 are damaged by excessive collector currents. More specifically, if and when the level of a continuous noise such as a white noise applied to the input terminal 701 increases by virtue of a decrease of the intensity of electric field of a broadcasting signal being received, the degree of conduction of the first and second control transistors 751 and 752 of the input limiting circuit 75 accordingly increases, so that a very large collector current flows therethrough. Therefore, there is a fear that the first and second transistors 751 and 752 are damaged by such large collector currents.

According to another embodiment of the present invention, therefore, a series current limiting resistor is connected to the collector electrode of the first control transistor 751, as shown by the reference numeral 76 in FIG. 2. In operation, if and when a continuous noise of a larger level is applied to the input terminal 701 and the collector current $I_1$ of the first control transistor 751 increases, then a voltage drop across the above described current limiting resistor 76 accordingly increases and the collector voltage of the first control transistor 751 accordingly decreases. When the collector current $I_1$ of the first control transistor 751 reaches a predetermined value, the above described first control transistor 751 becomes saturated, whereby an increase of the collector current is stopped, whereby the first and second control transistors 751 and 752 and the transistors 753, 754 and 755 of the current mirror circuit are prevented from being damaged. For the purpose of a simplified scheme for prevention of transistor damage, the embodiment shown in FIG. 2 is sufficient.

Figure 5:
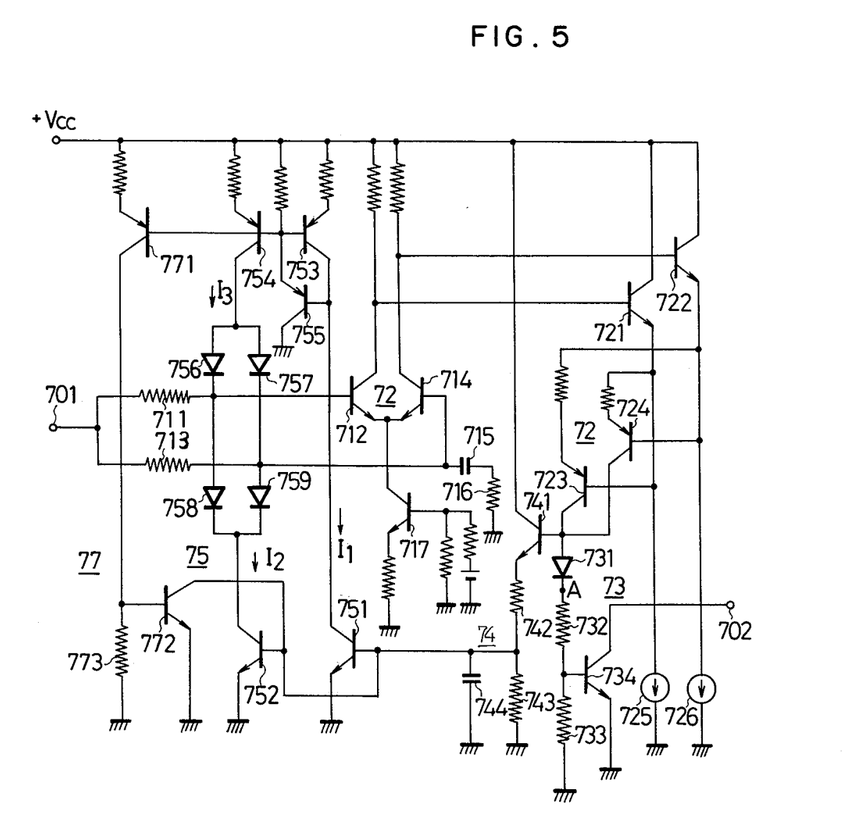
FIGS. 5 to 8 show schematic diagrams of different embodiments of the present invention.

FIG. 5 shows a schematic diagram of a further embodiment of the present invention. As described previously, the protecting or limiting resistor 76 employed in the FIG. 2 embodiment is fully effective to prevent damage of the transistors in a normal operation state. However, the FIG. 2 embodiment involves a shortcoming that in case of a decreased source voltage +Vcc the first control transistor 751 becomes saturated when the collector current $I_1$ of the transistor 751 is still small, resulting in a narrowed control range. In addition, conversely in case of an increased source voltage +Vcc, a situation occurs that the first control transistor 751 does not become saturated even when the collector current of the transistor 751 becomes relatively large, resulting in a fear that the first control transistor 751 is damaged.

The FIG. 5 diagram employs a protecting circuit 77 which is adaptably operable to variation of the source voltage +Vcc as described previously. The protecting circuit 77 comprises a third current mirror transistor 771 adapted to operate in the same manner as the transistors 753 and 754 constituting the current mirror circuit and a current limiting transistor 772 adapted to be operable by the collector current of the third current mirror transistor 771 and thus the voltage across the bias resistor 773.

If and when an input signal applied to the input terminal 701 increases and the collector current of the first control transistor 751 increases, then a current equal to the above described collector current flows through the second control transistor 752 and the third current mirror transistor 771. Thus, a voltage is developed across the resistor 773 in association with the collector current of the third current mirror transistor 771. Accordingly, if and when the value of the above described resistor 773 is suitably selected, then the current control transistor 772 becomes conductive when a predetermined collector current of the third current mirror transistor 771, i.e. a predetermined collector current of the first control transistor 751 flows, whereby the base currents of the above described first and second control transistors 751 and 752 are bypassed. As a result, the collector currents of the first and second control transistors 751 and 752 are limited, whereby both transistors 751 and 752 are prevented from being damaged. The protecting circuit 77 shown in FIG. 5 achieves a major purpose of preventing the damage of the transistors as described previously, in which a stabilized protecting operation can be performed irrespective of variation of the source voltage inasmuch as the operation is thoroughly dependent on the collector current of the third current mirror transistor 771.

Figure 6:
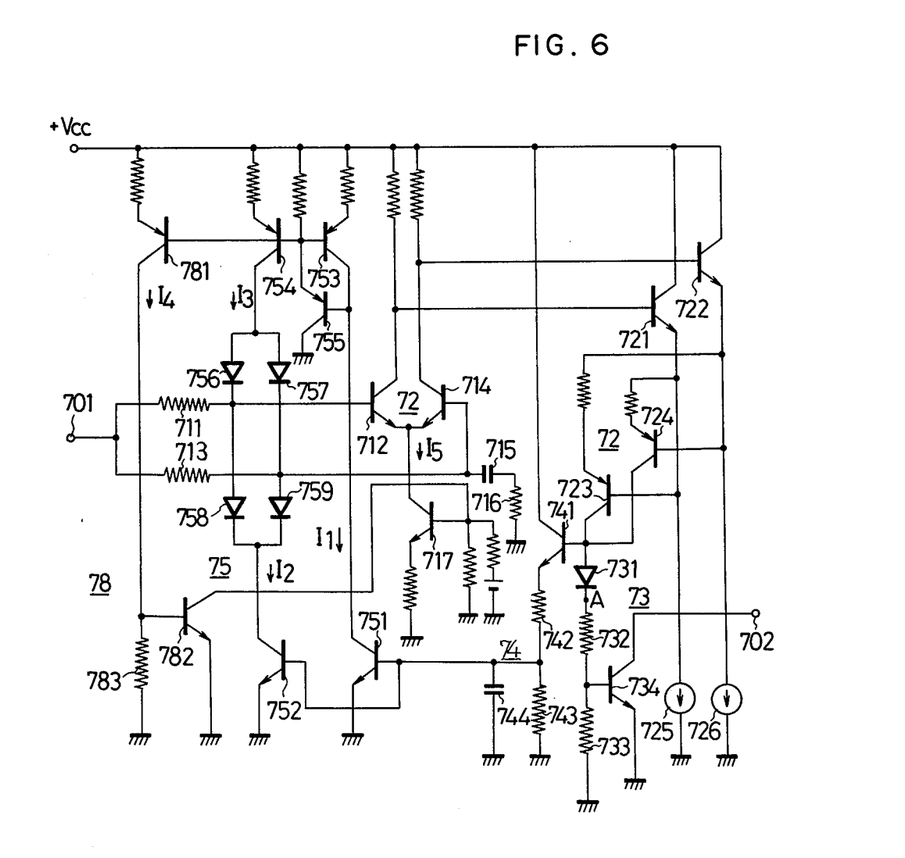

FIG. 6 shows a schematic diagram of still a further embodiment of the present invention. The embodiment shown is characterized by a protecting circuit 78 for protecting the circuit components by controlling the constant current transistor 717 when the current flowing through the transistor 751 of the amplitude limiting circuit 75 is too large, thereby to decrease the current flowing through the pair of transistors 712 and 714 constituting the differential amplifier 71. The protecting circuit 78 is similar to the protecting circuit 77 described previously with reference to FIG. 5, the difference being that the collector electrode of the transistor 782 is connected to the base electrode of the constant current transistor 717 rather than to the base electrodes of the transistors 751 and 752.

In operation, a current equal to the collector current $I_3$ of the other transistor 752 constituting the current mirror circuit is obtained at the collector electrode of the third current mirror transistor 781 of the protecting circuit 78. Assuming that the collector current of the third mirror transistor 781 is $I_4$ and the resistance value of the resistor 783 is R, then the transistor 782 starts conducting when the following formula is met:

$$I_4 \cdot R > V_{BE} \qquad (5)$$

where $V_{BE}$ is the base-emitter voltage of the current limiting transistor 782. The collector electrode of the transistor 782 is connected to the base electrode of the constant current transistor 717. Therefore, if and when the transistor 782 becomes conductive, then the base voltage and thus the base current of the constant current transistor 717 decreases and the collector current $I_5$ of the transistor 717 accordingly decreases. Therefore, the gain of the differential amplifier 71 decreases and an increase of the collector current $I_1$ of the first control transistor 751 is stopped.

Thus, according to the protecting circuit 78 of the FIG. 6 embodiment, the transistor 782 is driven by the collector current $I_4$ of the third transistor 781 determinable by the formula (5), whereby the gain of the differential amplifier 71 is controlled. As a result, the collector currents $I_1$ and $I_2$ of the first and second control transistors 751 and 752 do not exceed a predetermined value and thus the first and second control transistors 751 and 752 are protected from being damaged.

In summary, gain control is performed such that while an input signal is small, the gain control is not performed at all, but as the input signal increases, the amplitude of the input signal is limited, and when the input signal further increases, the input limiting operation is terminated and instead the gain of the differential amplifier 71 is directly controlled. Thus, the protecting circuit 78 brings about various advantages such as prevention of damage of control transistors, a broadened range of the gain control, and restriction of the current of the voltage source.

Figure 7:
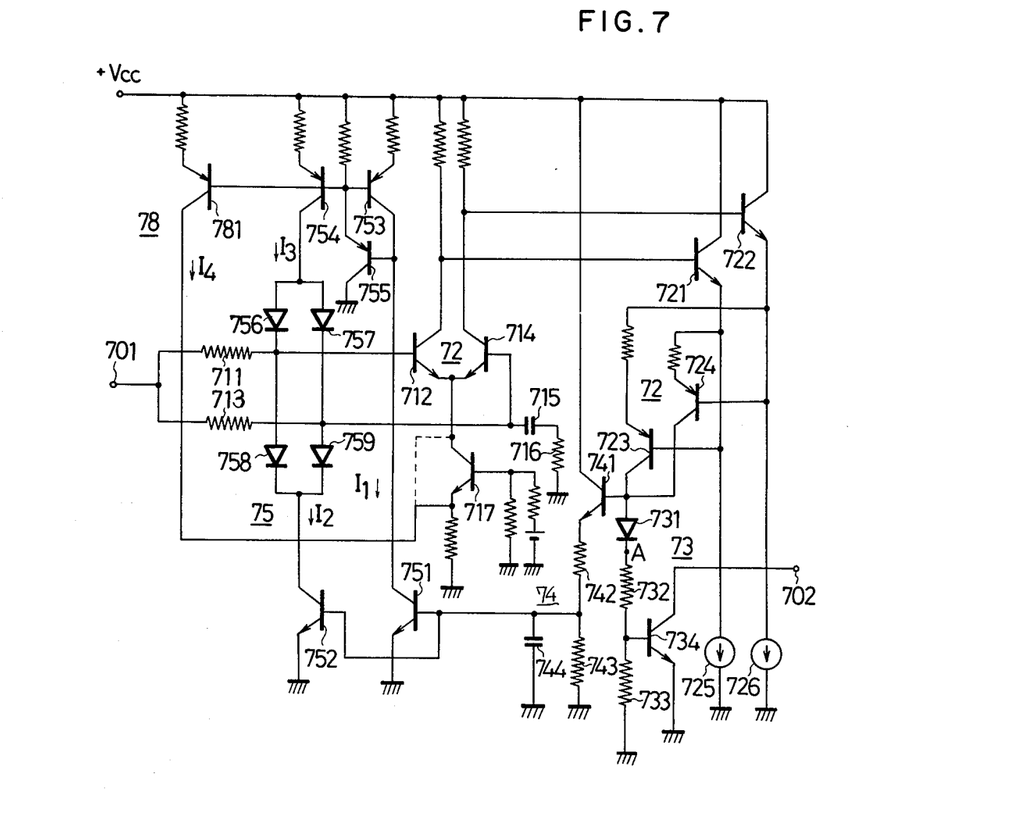

FIG. 7 shows a schematic diagram of still a further embodiment of the present invention. The FIG. 7 diagram is characterized by a protecting circuit 78, similar to the FIG. 6 embodiment. The protecting circuit 78 of the FIG. 7 embodiment comprises a transistor 781 the collector electrode of which is directly connected to the emitter electrode of the constant current transistor 717. In operation, if and when an input signal increases and the collector current $I_1$ flows through the first control transistor 751, the current $I_2$ of the same value flows through the second control transistor 752, whereby the amplitude of the input signal is limited. At the same time the collector current $I_4$ of the same value as that of the collector current $I_1$ of the first control transistor 751 flows through the transistor 781, whereby the collector current $I_5$ of the constant current transistor 717 decreases by the value of the above described collector current $I_4$, with the result that the gain of the differential amplifier 71 is directly controlled. Accordingly, the gain controls of different types are performed at the same time, with the result of an advantage that the control sensitivity is enhanced. In addition, another advantage is achieved that a variation of the current of the voltage source is limited to the minimum. More specifically, if and when a weak input signal is obtained, the first and second control transistors 751 and 752 are non-conductive, so that only the collector current $I_5$ flows through the constant current transistor 717, but if and when an extremely large input signal is applied, the collector currents $I_1$ and $I_2$ flows through the first and second control transistors 751 and 752 and the collector current $I_4$ flows through the transistor 781 of the protecting circuit 78, while the collector current $I_5$ of the constant current transistor 717 becomes approximately zero, so that only an increase of the current of $2I_0$ at the most merely results, assuming that the initial emitter current of the constant transistor 717 is $I_0$.

Thus, according to the FIG. 7 embodiment, the current flowing through the constant current transistor 717 is controlled. To that end, however, it would be appreciated that the collector electrode of the transistor 781 may be directly connected to the collector electrode of the constant current transistor 717, as shown by the dotted line of FIG. 7.

Figure 8:
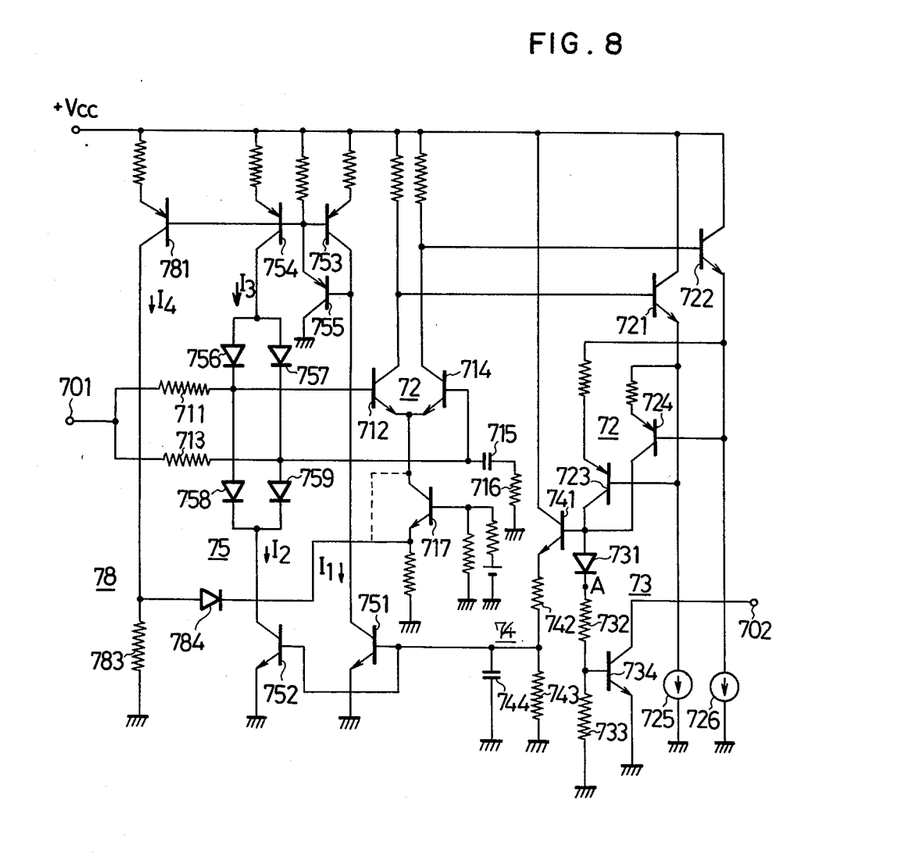

FIG. 8 shows a schematic diagram of still a further embodiment of the present invention. The embodiment shown is also characterized by a protecting circuit 78, as similar to the embodiments shown in FIGS. 6 and 7. In comparison of the FIG. 8 embodiment with the FIG. 6 embodiment, a diode 784 is provided in the FIG. 8 embodiment in view of the transistor 782 of the FIG. 6 embodiment, wherein the anode of the diode 784 is connected to the collector electrode of the transistor 781 and the cathode of the diode 784 is connected to the emitter electrode or the collector electrode of the constant current transistor 717. According to the FIG. 8 embodiment, even if an input signal increases so that the first and second control transistors 751 and 752 become conductive, whereby the amplitude of the input signal is limited, the gain of the differential amplifier 71 is not controlled unless the diode 784 is rendered conductive. If and when the input signal further increases so that the collector current $I_4$ of the transistor 781 of the protecting circuit 78 increases and the voltage developed across the resistor 783 reaches a predetermined level, then the above described diode 784 is rendered conductive, whereby the gain of the differential amplifier 78 is directly controlled, whereby gain control is started. Upon initiation of the above described gain control, an increase of the collector current $I_1$ of the first control transistor 751 is stopped, whereby protection of damage is performed.

Figure 9:
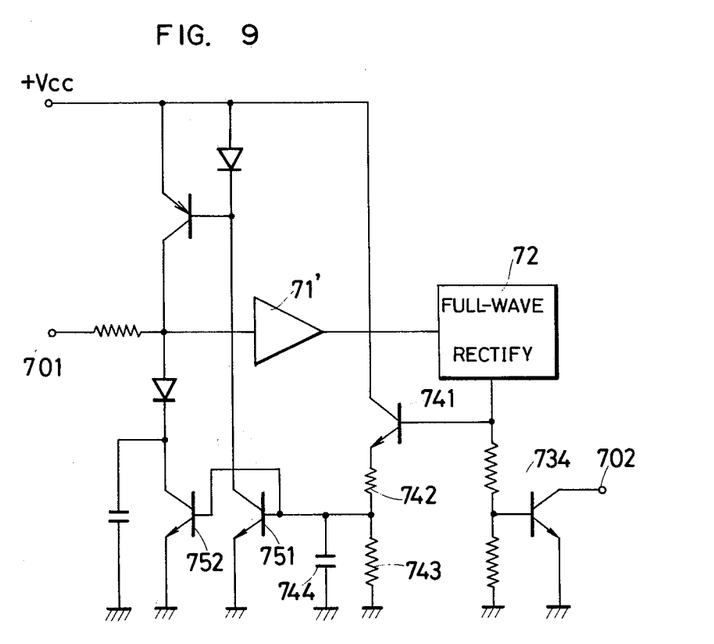
FIG. 9 is a schematic diagram showing another example of the amplifier employed in the present invention.

FIG. 9 shows a schematic diagram of another embodiment of the amplifying circuit for use in the present invention. Although in the above described embodiments the differential amplifier was employed as an amplifying circuit 71', the amplifying circuit may be structured as shown in FIG. 9.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. Apparatus for detecting a pulsive component randomly interspersed in an input signal having a substantially continuous noise component comprising:
   amplifying means having an input for receiving said input signal and an output,
   means connected to the output of said amplifying means for generating a control signal corresponding to the amplitude level of said continuous noise component of the input signal,
   means connected to the input of said amplifying means and responsive to said control signal for controlling the amplitude of the input signal applied to said amplifying means to maintain a substantially predetermined amplitude level for said continuous noise component at the output of said amplifying means, and
   means responsive to the output of said amplifying means for detecting a pulsive component exceeding a predetermined level above said predetermined level of said continuous noise component.

2. Apparatus as in claim 1 wherein said means for controlling the amplitude of said input signal comprises attenuating means which are operative when the amplitude of said continuous noise component exceeds a predetermined level.

3. An apparatus for detecting a pulsive component in accordance with claim 2 wherein said means for attenuating the amplitude of said input signal comprises circuit components, and means responsive to an overcurrent in said circuit components for protecting said circuit components.

4. An apparatus for detecting a pulsive component in accordance with claim 2, wherein
   said amplifying means comprises transistor means connected to receive said input signal at the input circuit thereof, and
   said means for attenuating the amplitude of said input signal being connected to said input circuit of said transistor means.

5. An apparatus for detecting a pulsive component in accordance with claim 4, wherein said means for attenuating the amplitude of said input singal comprises
   first transistor means having a current path thereof and responsive to said control signal corresponding to the level of said continuous component included in the output of said amplifying means for varying the conduction thereof,
   second transistor means having a current path thereof connected to said input of said transistor means of said amplifying means, and
   current mirror circuit means provided in association with the respective current paths of said first and second transistor means for controlling the currents flowing through the respective current paths of said first and second transistor means to be equal.

6. An apparatus for detecting a pulsive component in accordance with claim 5, wherein said means for generating said control signal comprises
   detector means for detecting the continuous noise component of the output of said amplifying means, and
   capacitor means for being charged responsive to the output of said detector means,
   said first transistor means being responsive to the charge stored in said capacitor means for varying the conduction thereof.

7. An apparatus for detecting a pulsive component in accordance with claim 5, wherein said means for attenuating the amplitude of said input signal further comprises current limiting means for limiting the current flowing through the current path of said first transistor means.

8. An apparatus for detecting a pulsive component in accordance with claim 7, wherein said current limiting means operates if and when the current flowing through said current path of said first transistor means exceeds a predetermined value.

9. An apparatus for detecting a pulsive component in accordance with claim 7, wherein said current limiting means comprises current limiting resistor means connected in series with said current path of said first transistor means.

10. An apparatus for detecting a pulsive component in accordance with claim 7, wherein said current limiting means comprises
    third transistor means for conducting current which is of the same value as that of said first transistor means, and
    base current controlling means responsive to the current flowing through said third transistor means for controlling the base current of said first transistor means.

11. An apparatus for detecting a pulsive component in accordance with claim 10, wherein said base current limiting means comprises transistor means.

12. An apparatus for detecting a pulsive component in accordance with claim 4, wherein said amplifying means comprises differential amplifying means.

13. An apparatus for detecting a pulsive component in accordance with claim 12, wherein said differential amplifying means comprises a pair of transistor means having the same conductivity type, each having a base electrode, an emitter electrode and a collector electrode, and constant current source means,
    the base electrodes of said pair of transistor means being commonly connected to receive said input signal,
    said emitter electrodes of said pair of transistor means being commonly connected to said constant current source means,
    said base electrode of one of said pair of transistor means being grounded to alternating current.

14. An apparatus for detecting a pulsive component in accordance with claim 13, wherein said means for attenuating the amplitude of said input signal comprises means for varying the impedance between the base electrodes of said pair of transistor means forming said differential amplifying means.

15. An apparatus for detecting a pulsive component in accordance with claim 4 wherein said amplifying means comprises differential amplifying means including a pair of transistor means having the same conductivity type, each having a base electrode, an emitter electrode and a collector electrode, and constant current source means,
    the base electrodes of said pair of transistor means being commonly connected to receive said input signal,
    said emitter electrodes of said pair of transistor means being commonly connected to said constant current source means, said base electrode of one of said pair of transistor means being grounded to alternating current.

16. An apparatus for detecting a pulsive component in accordance with claim 15, wherein
said impedance varying means comprises diode circuit means coupled between said current mirror circuit means and said current path of said second transistor means, and
said diode circuit means comprises a parallel connection of two series connections, each series connection comprising a series connection of diodes,
the junction of diodes of one series connection of said parallel connection being connected to the base electrode of one of said pair of transistor means, and
the junction of the diodes of the other series connection of said parallel connection being connected to the base electrode of the other transistor means of said pair of transistor means.

17. An apparatus for detecting a pulsive component in accordance with claim 15, which further comprises control means responsive to an increase of the current flowing through said current path of said first transistor means of said means for attenuating the amplitude of said input signal for decreasing the current of said constant current source means commonly connected to the emitter electrodes of said pair of transistor means of said differential amplifying means.

18. An apparatus for detecting a pulsive component in accordance with claim 17, wherein said control means for controlling the current of said constant current source means is adapted to be rendered effective when the current flowing through said current path of said first transistor means exceeds a predetermined value.

19. An apparatus for detecting a pulsive component in accordance with claim 17, wherein said control means for controlling the current of said constant current source means comprises fourth transistor means adapted for allowing for flow of the current which is the same as that of said first transistor means, whereby the current of said constant current source means is varied responsive to the current of said fourth transistor means.

20. An apparatus for detecting a pulsive component in accordance with claim 19, wherein said constant current source means commonly connected to said emitter electrodes of said pair of transistor means forming said differential amplifying means comprises constant current transistor means.

21. An apparatus for detecting a pulsive component in accordance with claim 20, wherein said control means for controlling the current of said constant current source means further comprises control device means responsive to the current of said fourth transistor means for controlling the base current of said constant current transistor means.

22. An apparatus for detecting a pulsive component in accordance with claim 21, wherein said control device means comprises transistor means.

23. An apparatus for detecting a pulsive component in accordance with claim 20, wherein said control means for controlling the current of said constant current source means is adapted such that the emitter current of said constant current transistor means is controlled responsive to the current of said fourth transistor means.

24. An apparatus for detecting a pulsive component in accordance with claim 23, wherein said control means for controlling the current of said constant current source means comprises device means responsive to the current of said fourth transistor means for varying the emitter current of said constant current transistor means.

25. An apparatus for detecting a pulsive component in accordance with claim 24, wherein said device means comprises diode means.

26. An apparatus for detecting a pulsive component in accordance with claim 20, wherein said control means for controlling the current of said constant current source means is adapted such that the collector current of said constant current transistor means is controlled responsive to the current of said fourth transistor means.

27. An apparatus for detecting a pulsive component in accordance with claim 26, wherein said control means for controlling the current of said constant current source means comprises device means responsive to the current of said fourth transistor means for controlling the collector current of said constant current transistor means.

28. An apparatus for detecting a pulsive component in accordance with claim 27, wherein said device means comprises diode means.

* * * * *